United States Patent
Gebreselasie et al.

(10) Patent No.: US 9,318,217 B1
(45) Date of Patent: Apr. 19, 2016

(54) PROGRAMMING AN ELECTRICAL FUSE WITH A SILICON-CONTROLLED RECTIFIER

(71) Applicant: GLOBALFOUNDRIES INC., Grand Cayman, KY (US)

(72) Inventors: Ephrem G. Gebreselasie, South Burlington, VT (US); Alain Loiseau, Williston, VT (US); Joseph M. Lukaitis, Pleasant Valley, NY (US); Richard A. Poro, III, Pittsford, VT (US); Andreas D. Stricker, Milpitas, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/522,017

(22) Filed: Oct. 23, 2014

(51) Int. Cl.
| | | |
|---|---|---|
| H01H 37/76 | (2006.01) | |
| G11C 17/16 | (2006.01) | |
| H03K 19/177 | (2006.01) | |
| G06F 17/50 | (2006.01) | |

(52) U.S. Cl.
CPC ............ *G11C 17/16* (2013.01); *G06F 17/5068* (2013.01); *H03K 19/17768* (2013.01)

(58) Field of Classification Search
CPC .............................. G11C 17/16; G11C 17/165
See application file for complete search history.

(56) References Cited

U.S. PATENT DOCUMENTS

| | | | |
|---|---|---|---|
| 4,605,872 A | 8/1986 | Rung | |
| 5,859,562 A | 1/1999 | McCollum | |
| 6,330,204 B1 * | 12/2001 | Miyagi | G11C 16/22 365/189.04 |
| 7,429,886 B2 * | 9/2008 | Huang | G11C 17/18 327/525 |
| 8,183,638 B2 | 5/2012 | Hung | |
| 8,625,377 B2 | 1/2014 | Rountree | |
| 2013/0201772 A1 | 8/2013 | Rountree | |
| 2014/0071774 A1 | 3/2014 | Rountree | |

FOREIGN PATENT DOCUMENTS

TW    200809896 A    2/2008

\* cited by examiner

*Primary Examiner* — Jeffrey Zweizig
(74) *Attorney, Agent, or Firm* — Thompson Hine LLP; Anthony J. Canale (57) ABSTRACT

Circuits for programming an electrical fuse, methods for programming an electrical fuse, and methods for designing a silicon-controlled rectifier for use in programming an electrical fuse. A programming current for the electrical fuse is directed through the electrical fuse and the silicon-controlled rectifier. Upon reaching a programmed resistance value for the electrical fuse, the silicon-controlled rectifier switches from a low-impedance state to a high-impedance state that interrupts the programming current.

20 Claims, 6 Drawing Sheets

PROGRAMMING AN ELECTRICAL FUSE WITH A SILICON-CONTROLLED RECTIFIER

BACKGROUND

The invention relates generally to semiconductor devices and integrated circuit fabrication and, in particular, to circuits for programming an electrical fuse, methods for programming an electrical fuse, and methods for designing a silicon-controlled rectifier used to program an electrical fuse.

Programmable devices, such as electrical fuses (i.e., efuses), are used in various programmable integrated circuits, such as redundancy circuits of dynamic random access memories and static random access memories, programmable logic devices (PLDs), I/O circuits, and chip identification circuits. Conventional electrical fuses include a long, narrow fuse link connecting two larger plates defining an anode and a cathode. Electrical fuses may be dynamically programmed in real time by passing an electrical current through the fuse link.

A silicon-controlled rectifier (SCR) is a multiple-layer solid state device commonly utilized in current control applications. A silicon-controlled rectifier includes multiple electrodes or terminals and specifically includes an anode, a gate, and a cathode identifiable among its layers. In its high-impedance state, the silicon-controlled rectifier restricts current conduction to leakage current. However, a triggering signal applied to the gate can switch the silicon-controlled rectifier to a low-impedance state such that current is conducted between the anode and cathode. After the triggering signal is removed from the gate, the SCR remains in its low impedance state so long as the conducted current exceeds a holding current. When the conducted current drops below the holding current, the silicon-controlled rectifier returns to its high-impedance state.

Improved circuits for programming an electrical fuse, methods for programming an electrical fuse, and methods for designing a silicon-controlled rectifier for use in programming an electrical fuse are needed.

SUMMARY

In an embodiment of the invention, a method is provided for programming an electrical fuse using a silicon-controlled rectifier that has an anode coupled with the electrical fuse. A programming current for the electrical fuse is directed through the electrical fuse and the silicon-controlled rectifier. Upon reaching a programmed resistance value for the electrical fuse, the silicon-controlled rectifier is switches from a low-impedance state to a high-impedance state that interrupts the programming current.

In an embodiment of the invention, a circuit includes an electrical fuse configured to be programmed by the application of a programming current over a time interval. The circuit further includes a silicon-controlled rectifier including a gate, an anode coupled with the electrical fuse, and a cathode. A trigger pulse generator is coupled with the gate of the silicon-controlled rectifier. The trigger pulse generator is configured to direct a triggering pulse to the gate of the silicon-controlled rectifier having a duration that is an order of magnitude less than the time interval required to program the electrical fuse.

In an embodiment of the invention, a method is provided for designing a silicon-controlled rectifier for use in programming an electrical fuse. The method comprises determining, using a processor, a holding current and a holding voltage for the silicon-controlled rectifier that provide a programmed resistance value for the electrical fuse.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
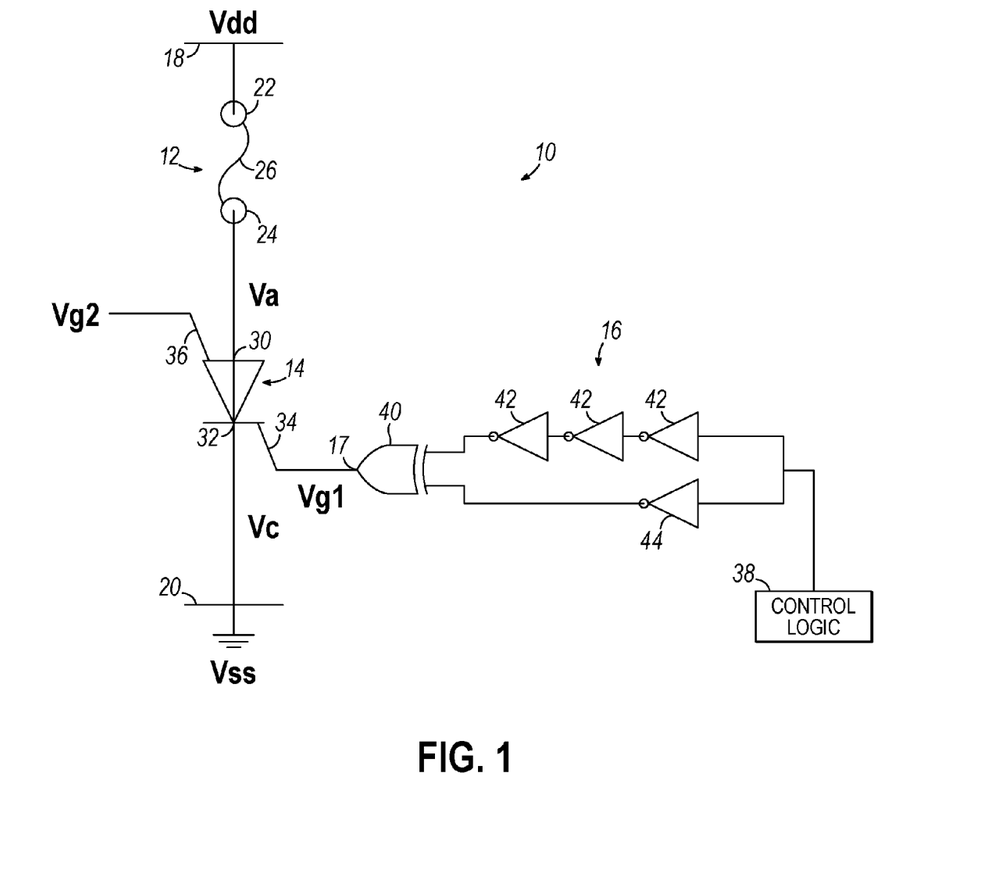
FIG. 1 is a circuit diagram for a circuit that includes an electrical fuse, a silicon-controlled rectifier, and a trigger pulse generator in accordance with an embodiment of the invention.
Figure 2:
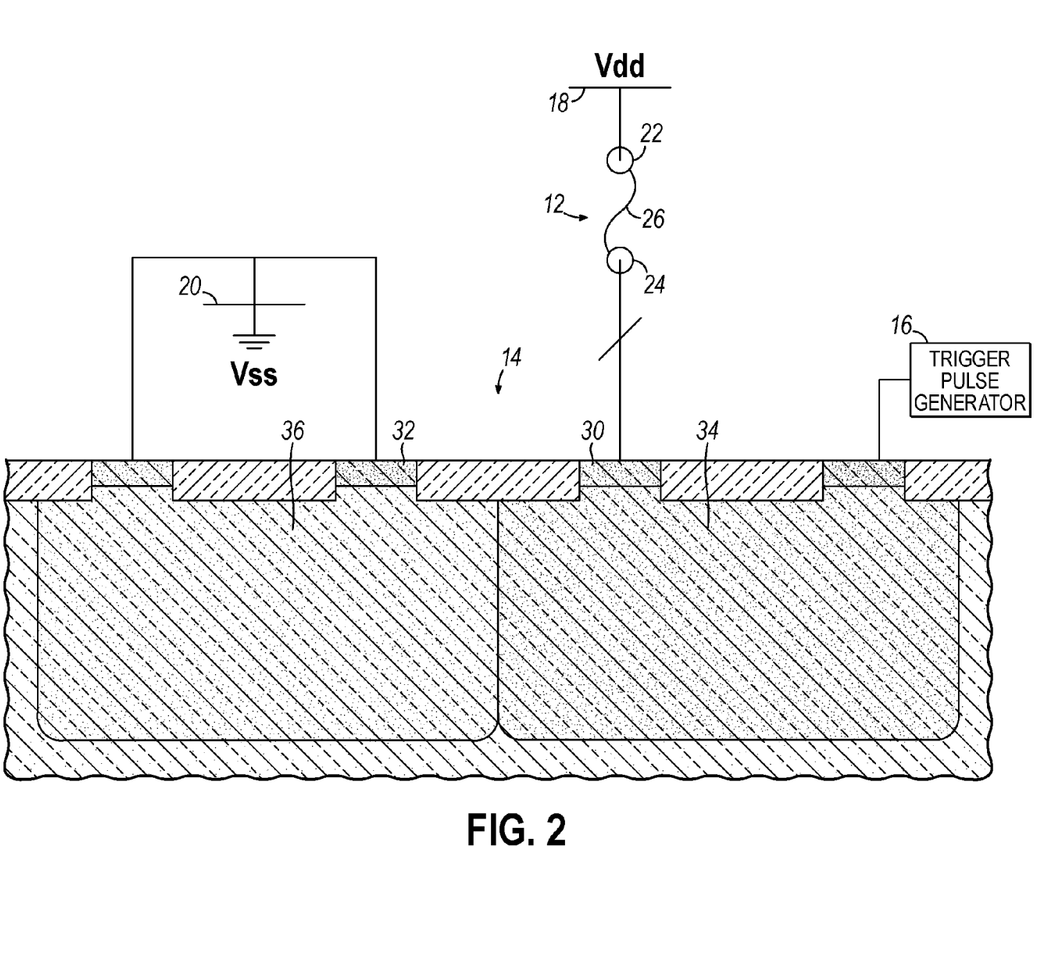
FIG. 2 is a cross-sectional view of the silicon-controlled rectifier in the circuit of FIG. 1.

With reference to FIGS. 1, 2 and in accordance with an embodiment of the invention, a circuit 10 for a chip generally includes an electrical fuse 12, a silicon-controlled rectifier 14, and a trigger pulse generator 16 coupled with the silicon-controlled rectifier 14. The electrical fuse 12 and silicon-controlled rectifier 14 are coupled in series between a positive power supply (Vdd) rail 18 and a negative power supply (Vss) rail 20. The Vdd rail 18 is connected with a Vdd power pin of the chip and the Vss rail 20 is connected with a Vss power pin of the chip. The negative power supply voltage at the Vss rail 20 may be ground potential.

The electrical fuse 12 may include one or more layers of conductive materials from which terminals 22, 24 and a fusible link 26 are formed. The fusible link 26 may be a length of the one or more layers with reduced cross-sectional area that is located between terminal 22 and terminal 24. The electrical fuse 12 may include a layer of a conductive material, such as copper (Cu), aluminum (Al), and/or silicon or polysilicon (Si). This layer may be clad by layers of other conductive materials, such as cobalt (Co), titanium (Ti), tantalum (Ta), titanium nitride (TiN), and tantalum nitride (TaN). One or more of the layers of the electrical fuses 12 may be susceptible to electromigration, particularly within the region of the fusible link 26, when exposed to a programming current.

The silicon-controlled rectifier 14 has a device construction that includes semiconductor regions of alternating conductivity type defining four electrodes or terminals, namely an anode 30, a cathode 32, a gate 34, and a gate 36. In one embodiment, the gate 34 of the silicon-controlled rectifier 14 may be comprised of an n-well that includes a semiconductor layer doped with a dopant, such as phosphorus (P), arsenic (As), antimony (Sb), or other available n-type dopant, in order to impart n-type conductivity to the semiconductor material. The gate 36 of the silicon-controlled rectifier 14 may be comprised of a p-well that includes a semiconductor layer doped with a dopant, such as boron (B), aluminum (Al), gallium (Ga), or any other available p-type dopant, in order to impart p-type conductivity to the semiconductor material. The anode 30 of the silicon-controlled rectifier 14 may be a doped region of p-type conductivity that is formed in the n-well, and the cathode 32 of the silicon-controlled rectifier 14 may be a doped region of n-type conductivity that is formed in the p-well. The anode 30, cathode 32, and gates 34, 36 of the silicon-controlled rectifier 14 may be formed by ion implantation of a dopant in the presence of a patterned ion-implantation mask. The implantation conditions (e.g., kinetic energy and dose) are selected to provide a desired dopant concentration (e.g., light, medium, or heavy doping), and multiple sets of implantation conditions may be used to form doped regions.

Control logic 38 directs the fuse programming operations of the trigger pulse generator 16 used to program the electrical fuse 12. The electrical fuse 12 may also be connected with sense circuitry that can be used to measure the resistance of the electrical fuse 12 in order to determine whether the electrical fuse 12 has been properly programmed to its targeted programmed resistance value. In particular, the sense circuitry can measure an approximate value of the fuse resistance to determine the state of the electrical fuse 12. One approach to measuring the fuse resistance is to compare the measured fuse resistance with the known resistance of a reference resistor. The control logic 38 may also be used to direct the fuse read operations of the sense circuitry.

The trigger pulse generator 16 may include an XOR gate 40, an inverter chain 42 coupled with an input to the XOR gate 40, and an inverter 44 coupled with the other input to the XOR gate 40. The trigger pulse generator 16 has an output 17 from the XOR gate 40 that, in the representative embodiment, is coupled with the gate 34 of the silicon-controlled rectifier 14. Under the direction and control of the control logic 38, the trigger pulse generator 16 is configured to provide a triggering pulse to the gate 34 of the silicon-controlled rectifier 14 that triggers the silicon-controlled rectifier 14 to enter its low-impedance state in which the electrical fuse 12 is programmed as discussed in detail hereinbelow. The XOR gate 40 is a digital logic gate that outputs a voltage level equal to logic 1 (high or $V_{DD}$) if one, and only one, of the inputs to the gate supplies a voltage level equal to logic 1 (high or $V_{DD}$). If both inputs receive a voltage level equal to logic 0 (low or $V_{SS}$), then the XOR gate 40 outputs a voltage level equal to logic 0 (low or $V_{SS}$). Based on the input signals and the time delay due to the different circuitry connected to the different inputs, the XOR gate 40 outputs a voltage level equal to logic 1 (high or $V_{DD}$) only over a time period of a duration that results in the generation of the trigger pulse.

Figure 1A:
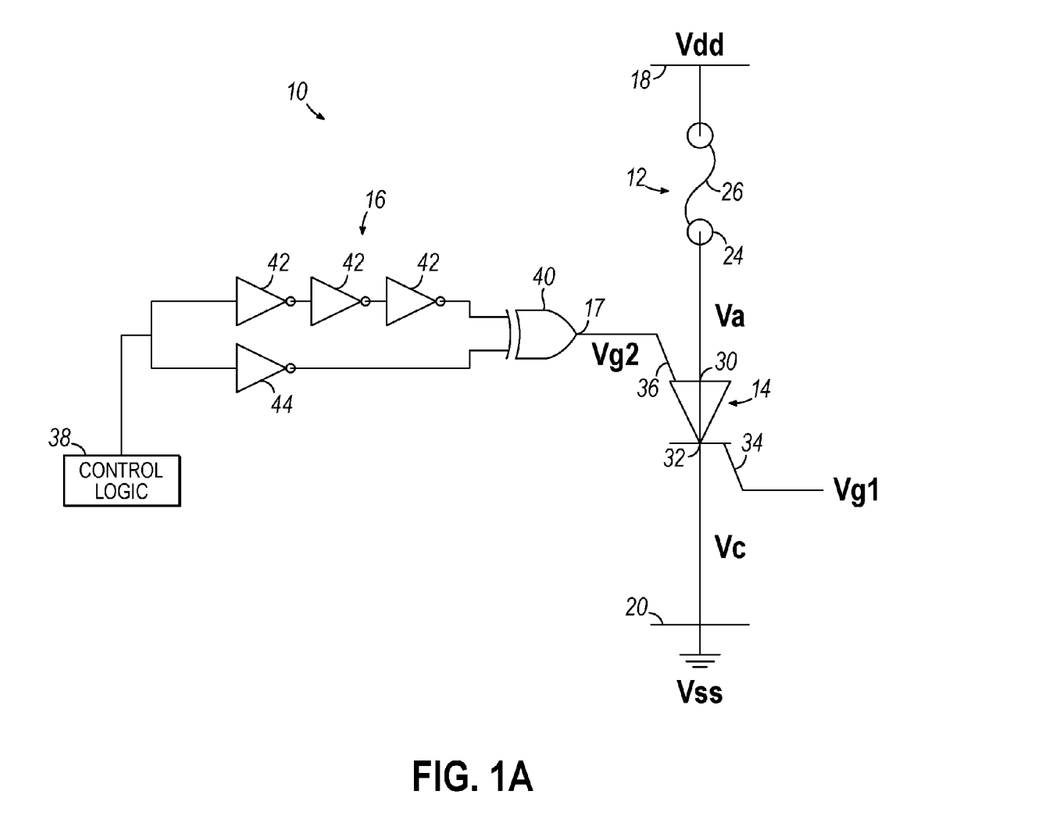
FIG. 1A is a circuit diagram similar to FIG. 1 in which the trigger pulse generator is coupled with a different gate of the silicon-controlled rectifier in accordance with an alternative embodiment of the invention.

In an alternative embodiment and as shown in FIG. 1A, the output 17 of the trigger pulse generator 16 is coupled with gate 36 of the silicon-controlled rectifier 14, and the triggering pulse is injected at gate 36. The operation of the circuit 10 for triggering the programming of the electrical fuse 12 is unchanged in the circuit arrangement in this alternative embodiment.

Figure 3:
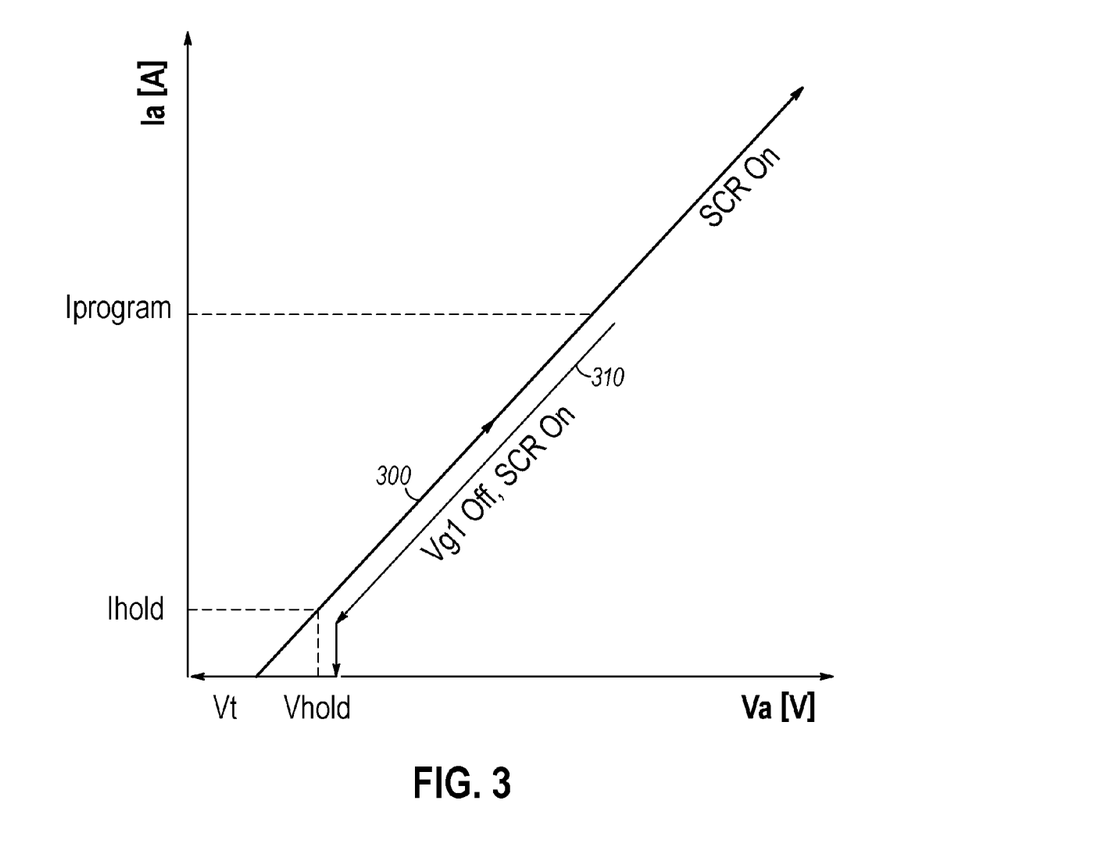
FIG. 3 is a diagrammatic view depicting the operation of the silicon-controlled rectifier in the circuit of FIG. 1 when programming the electrical fuse.

With reference to FIG. 3, the silicon-controlled rectifier 14 is turned on to enter its low-impedance state in response to the injection of the triggering pulse at the gate 34 of the silicon-controlled rectifier 14 from the trigger pulse generator 16. The triggering pulse is characterized by a trigger current and a pulse duration. Upon triggering, voltage at the anode 30 of the silicon-controlled rectifier 14 and the current through the silicon-controlled rectifier 14 increase, as indicated by line 300. In its low-impedance state, the silicon-controlled rectifier 14 defines a low-impedance current path for a load current flowing through the electrical fuse 12 and the silicon-controlled rectifier 14 from the Vdd rail 18 to the Vss rail 20. The triggering pulse is terminated and a current equal to the programming current (Iprogram) flows through the electrical fuse 12 and silicon-controlled rectifier 14. The trigger pulse ends before the silicon-controlled rectifier 14 returns to its high-impedance state. When the triggering pulse ends, the silicon-controlled rectifier 14 is not turned off. Instead, the silicon-controlled rectifier 14 remains clamped in its low-impedance state and the programming of the electrical fuse 12 continues. Because the triggering pulse from the trigger pulse generator 16 is not sustained or otherwise used to program the electrical fuse 12 beyond causing the silicon-controlled rectifier 14 to enter its low-impedance state, the characteristics of the silicon-controlled rectifier 14 determine the targeted programmed resistance value of the electrical fuse 12. The interruption of the trigger pulse before programming is completed also reduces the risk of over-programming and rupturing the electrical fuse 12 that could result if the silicon-controlled rectifier 14 were held on by an extended-duration trigger pulse and the switching of the silicon-controlled rectifier 14 to its high impedance state occurred coincident with the end of the extended-duration trigger pulse.

As current flows through the electrical fuse 12 and the silicon-controlled rectifier 14 during programming, a voltage drop occurs across the electrical fuse 12 and another voltage drop occurs across the silicon-controlled rectifier 14. The sum of these voltage drops is equal to the voltage at the Vdd rail 18. As the resistance of the electrical fuse 12 increases over time during programming, the voltage drop across the electrical fuse 12 increases and the voltage drop across the silicon-controlled rectifier 14 decreases. Eventually, as the voltage across the silicon-controlled rectifier 14 decreases along line 310, the current through the silicon-controlled rectifier 14 reaches Ihold and a corresponding holding voltage (Vhold), at which point in time the silicon-controlled rectifier 14 turns off and re-enters its high impedance state. When the silicon-controlled rectifier 14 returns to its high impedance state and current flow ceases, the electrical fuse 12 is programmed with its targeted programmed resistance value. The programmed resistance value of the electrical fuse 12 may be a few kΩ's.

The specific value selected for Iprogram ensures an appropriate current is provided to the electrical fuse 12 and represents a minimum value for the programming current so long as the electrical fuse 12 is not blown by its application to an extent that an open circuit is created. The specific values selected for Ihold and Vhold of the silicon-controlled rectifier 14 ensure a nominal value for the programmed fuse resistance.

As a result of programming, the programmed value for the electrical resistance of the electrical fuse 12 is increased compared with its pre-programmed electrical resistance. The programmed electrical fuse 12 defines a closed electrical circuit for current flow that exists after the programming current is removed. The mechanism functioning to program the electrical fuse 12 may be, for example, electromigration. The electrical fuse 12 may be programmed in the field using the trigger pulse generator 16. In the alternative, the electrical fuse 12 may be programmed using a semiconductor test system capable of providing pulses characterized by a variable voltage and current, which would ordinarily be used for parametric measurements but can also be used in a different context to program the electrical fuse 12.

The layout of the silicon-controlled rectifier 14 can be selected such that the silicon-controlled rectifier 14 automatically turns off at a value of Ihold and a value of Vhold that provides a targeted programmed resistance value for the electrical fuse 12. These specific values of Ihold and Vhold can be determined from the layout of the silicon-controlled rectifier 14, and then used to control the programming of the electrical fuse 12 in conjunction with knowledge of the value of the power supply voltage at the positive power supply (Vdd) rail 18. In this manner, multiple electrical fuses 12 can be systematically programmed to a targeted programmed value for its resistance based upon the layout of the silicon-controlled rectifier 14 to provide a tight distribution of resistance values that are nominally equal to the targeted programmed resistance value. The silicon-controlled rectifier 14 will remain in its low impedance state, after the triggering pulse ends, until the targeted programmed resistance value for the electrical fuse 12 is reached at Ihold. Upon reaching the targeted programmed resistance value for the electrical fuse 12, the silicon-controlled rectifier 14 will revert to its high impedance state and the flow of current through the electrical fuse 12 ceases. The electrical fuse 12 cannot be reprogrammed or un-programmed because programming is a one-time event. The enhanced control over the programming afforded by the silicon-controlled rectifier 14 and the limited duration of the trigger pulse that allows the silicon-controlled rectifier 14 to automatically switch from its low impedance state to its high impedance state, therefore, reduces the variability that would otherwise be hard-programmed into electrical fuses during these one-time events.

The values of Ihold, Vhold, Iprogram, and the programmed resistance are mathematically related. Through selection of the layout of the silicon-controlled rectifier 14, the values of Ihold and Iprogram for the silicon-controlled rectifier 14 may be engineered by selecting design parameters of the silicon-controlled rectifier 14. For example, given certain values, the values of Ihold and Iprogram for the silicon-controlled rectifier 14 can be determined from the set of equations:

$$I\text{hold}=(V\text{dd}-V\text{hold})/R(\text{final}), \text{ and}$$

$$I\text{program}=(V\text{dd}-V\text{anode})/R(\text{initial}),$$

where R(initial) is the resistance value of the electrical fuse 12 in its fabricated and unprogrammed state, R(final) is the targeted programmed resistance value of the electrical fuse 12, and Vanode is the voltage at the anode 30 of the silicon controlled rectifier 14. The resistance value of R(initial) prior to programming is determined by the design of the electrical fuse 12 (e.g., construction material(s), dimensions of the fusible link). In one embodiment, the Ihold of the silicon-controlled rectifier 14 may be between 0.2 mA and 5 mA. In one embodiment, the Vhold of the silicon-controlled rectifier 14 may be between 0.7 V and 1.5 V.

The value of Vtrigger for the silicon-controlled rectifier 14 can be determined, based upon which of the gates 34, 36 of the silicon-controlled rectifier 14 to which the trigger pulse generator 16 is coupled, from either:

$$V\text{trigger}=V\text{cathode}+0.7 \text{ V, or}$$

$$V\text{trigger}=V\text{cathode}-0.7 \text{ V}.$$

Based upon the value for the voltage level at Vdd and the programmed resistance value for the electrical fuse 12, the values of Ihold and Vhold can be determined. According to Ohms law, the programmed resistance value is proportional to a difference between the voltage value of the positive power supply and the holding voltage, and is inversely proportional to the holding current. By way of examples, the process for providing the programmed resistance value of the electrical fuse 12 at different values for the voltage level Vdd can be illustrated for a 2.5 µm silicon-controlled rectifier 14 characterized by a Vhold equal to 1.3 V and an Ihold equal to 1 mA.

If the voltage level at Vdd is equal to 3.3 V, then the voltage drop across the electrical fuse 12 immediately before the silicon-controlled rectifier 14 turns off is equal to the difference between Vdd and Vhold (i.e., 3.3V−1.3V=2V). The current through the electrical fuse 12, before the silicon-controlled rectifier 14 turns off, is equal to Ihold (i.e., 1 mA). The programmed resistance value (i.e., Rfuse) of the electrical fuse 12 is determined from Ohm's law to be 2 kiloohms or kΩ (i.e., Rfuse=Vfuse/Ifuse=2V/1 mA). Of course, values for the programmed resistance of the electrical fuse 12 and the voltage level at Vdd may be chosen, and the values for Ihold and Vhold determined.

If the voltage level at Vdd is equal to 2.5 V, then the voltage drop across fuse just before the silicon-controlled rectifier 14 turns off is equal to the difference between Vdd and Vhold (i.e., 2.5V−1.3V=1.2V). The current through the electrical fuse 12, before the silicon-controlled rectifier 14 turns off, is equal to Ihold (i.e., 1 mA). The programmed resistance value (i.e., Rfuse) of the electrical fuse 12 is determined from Ohm's law to be 1.2 kΩ (i.e., Rfuse=Vfuse/Ifuse=1.2V/1 mA).

If the voltage level at Vdd is equal to 5 V, then the voltage drop across fuse just before the silicon-controlled rectifier 14 turns off is equal to the difference between Vdd and Vhold (i.e., 5V−1.3V=3.7V). The current through the electrical fuse 12, before the silicon-controlled rectifier 14 turns off, is equal to Ihold (i.e., 1 mA). The programmed resistance value (i.e., Rfuse) of the electrical fuse 12 is determined from Ohm's law to be 3.7 kΩ (i.e., Rfuse=Vfuse/Ifuse=3.7V/1 mA).

The time to program the electrical fuse 12 may be measured from an initial time at which the triggering pulse is received by the silicon-controlled rectifier 14 from the trigger pulse generator 16 until a final time at which the voltage across silicon-controlled rectifier 14 reaches Vhold and the silicon-controlled rectifier 14 turns off. The triggering pulse supplied by the trigger pulse generator 16 to the silicon-controlled rectifier 14 is significantly shorter than the time required to program the electrical fuse 12 to achieve the targeted programmed electrical resistance. The time interval over which the electrical fuse 12 is programmed may range from 10 nanoseconds to 10 microseconds with the specific time interval dependent upon the device technology used to fabricate the electrical fuse 12. In one embodiment, the width of the triggering pulse supplied to the gates 34, 36 of the silicon-controlled rectifier 14 by the trigger pulse generator 16 may be at least an order of magnitude (i.e., a factor of greater than or equal 10) less than the time required to program the electrical fuse 12 to provide its targeted programmed value of resistance.

The layout of the silicon-controlled rectifier 14 may be altered by adjusting various different characteristics in the form of design parameters. One design parameter that may be used to select Vhold and Ihold is the tap length of the silicon-controlled rectifier 14. The tap length is a distance between the cathode 32 and the contact for the p-well. Another design parameter that may be used to select Vhold and Ihold is the spacing between the anode 30 and cathode 32. Yet another design parameter that may be used to select Vhold and Ihold is the width of the silicon-controlled rectifier 14.

Figure 4:
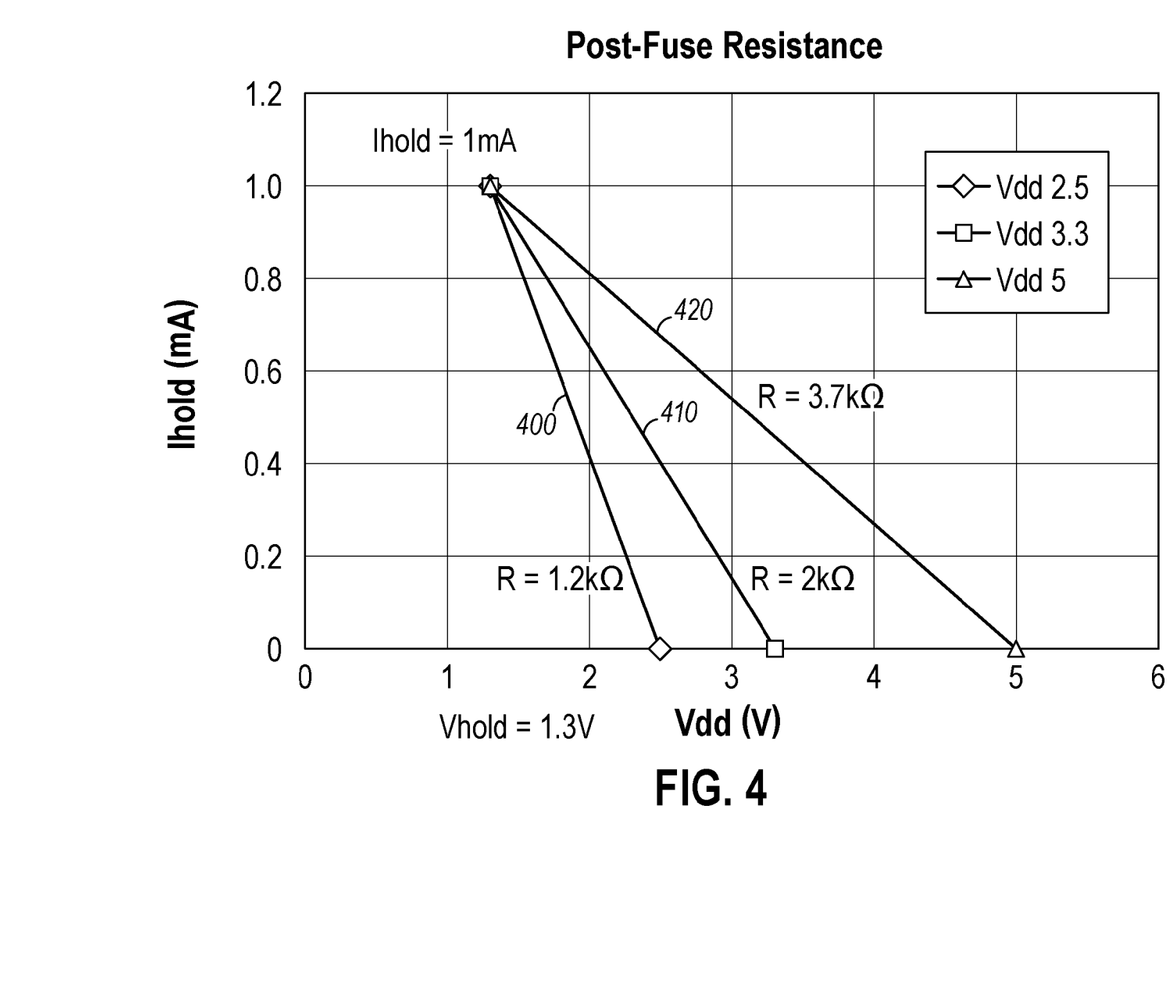
FIG. 4 is a diagrammatic view depicting the ability to select a programmed resistance value for the fuse of the circuit of FIG. 1 as a function of the positive power supply voltage and the holding current of the silicon-controlled rectifier.

With reference to FIG. 4, the impact of the voltage level at Vdd on the programmed resistance value of the electrical fuse 12 is illustrated for a silicon-controlled rectifier 14 having a fixed Vhold equal to 1.3 V. The curves in FIG. 4 are based on computations using the equations presented hereinabove. The value of Ihold is proportional to the difference between the values of the voltage level at Vdd and the holding voltage Vhold, and inversely proportional to the programmed resistance value. Curve 400 represents different values of Vdd and Ihold that can contribute to produce a programmed resistance value equal to 1.2 kΩ for the electrical fuse 12. Curve 410 represents different values of Vdd and Ihold that can contribute to produce a programmed resistance value equal to 2 kΩ for the electrical fuse 12. Curve 420 represents different values of Vdd and Ihold that can contribute to produce a programmed resistance value equal to 3.7 kΩ for the electrical fuse 12.

Figure 5:
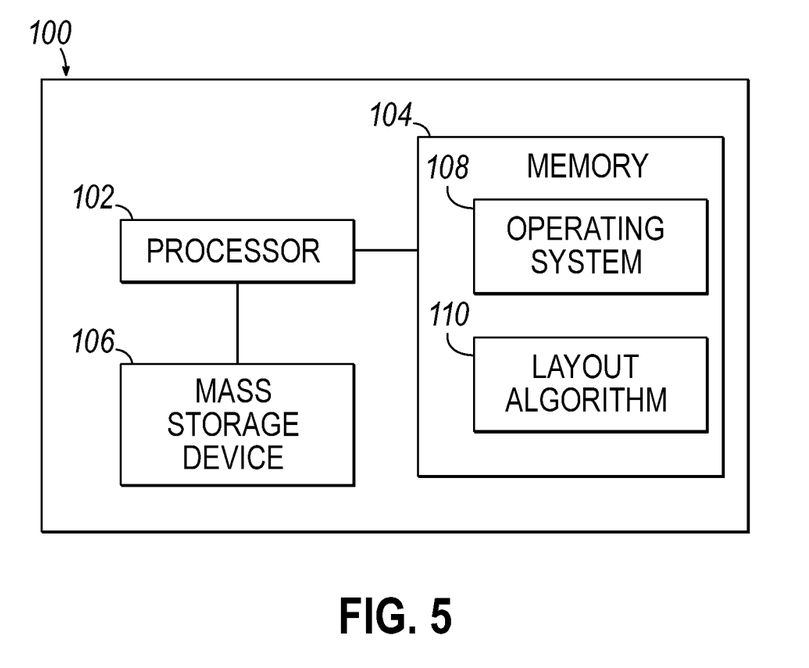
FIG. 5 is block diagram of a computer system that may be used to determine the characteristics of the silicon-controlled rectifier in the circuit of FIG. 1.

With reference to FIG. 5, a system 100 is provided for determining the layout of the silicon-controlled rectifier 14 such that, given a value of Vdd, the silicon-controlled rectifier 14 in the circuit 10 automatically switches off at values of Vhold and Ihold to provide a predictable and reproducible value for the programmed resistance of the electrical fuse 12. The system includes at least one processor 102 selected from controllers, microprocessors, micro-controllers, microcomputers, digital signal processors, central processing units, field programmable gate arrays, programmable logic devices, state machines, logic circuits, analog circuits, digital circuits, and/or any other devices that manipulate signals (analog and/or digital) based on operational instructions that are stored in a memory 104. The memory 104 may be a single memory device or a plurality of memory devices including but not limited to random access memory (RAM), volatile memory, non-volatile memory, static random access memory (SRAM), dynamic random access memory (DRAM), flash memory, cache memory, and/or any other device capable of storing digital information. The system 100 includes a mass storage device 106 may include one or more hard disk drives, floppy or other removable disk drives, direct access storage devices (DASD), optical drives (e.g., a CD drive, a DVD drive, etc.), and/or tape drives, among others.

Each processor 102 operates under the control of an operating system 108, and executes or otherwise relies upon computer program code embodied in various computer software applications, components, programs, objects, modules, data structures, etc. The computer program code residing in memory 104 and stored in the mass storage device 106 also includes a layout algorithm 110 that, when executing on the processor 102, uses numerical computations and calculations to determine the layout of the silicon-controlled rectifier 14 based on design rules. The computer program code typically comprises one or more instructions that are resident at various times in memory 104, and that, when read and executed by the processor 102, causes the system 100 to perform the steps necessary to execute steps or elements embodying the various embodiments and aspects of the invention. In particular, the instructions in the layout algorithm 110 may follow the logic flow described herein and generally outlined herein for determining a layout of the silicon-controlled rectifier 14 such that, given a value of Vdd, the silicon-controlled rectifier 14 in the circuit 10 automatically switches off at values of Vhold and Ihold to provide a predictable and reproducible value for the programmed resistance of the electrical fuse 12.

In general, the routines executed to implement the embodiments of the invention, whether implemented as part of an operating system or a specific application, component, program, object, module or sequence of instructions, or even a subset thereof, may be referred to herein as "computer program code," or simply "program code." Program code typically comprises computer readable instructions that are resident at various times in various memory and storage devices in a computer and that, when read and executed by one or more processors in a computer, cause that computer to perform the operations necessary to execute operations and/or elements embodying the various aspects of the embodiments of the invention. Computer readable program instructions for carrying out operations of the embodiments of the invention may be, for example, assembly language or either source code or object code written in any combination of one or more programming languages.

The silicon-controlled rectifier requires extremely simple trigger circuitry, and furnishes an automatic shut-off of the current supplied to the electrical fuse during programming. The ability to precisely generate a programmed resistance value for the electrical fuse that is predictable and reproducible may yield a tight, repeatable statistical distribution of programmed resistance values for various different electrical fuses programmed in the same manner. This may eliminate the wide variations observed in the values of programmed resistance for conventionally-programmed electrical fuses.

Field effect transistors, if used to program an electrical fuse, must be large in order to provide enough current to provide the programmed condition and may result in over-programming that reduces fuse reliability. The use of the silicon-controlled rectifier eliminates the need for such large field effect transistors and may increase the reliability of the programmed electrical fuses. In particulate, the silicon-controlled rectifier may be utilized to program the electrical fuse without risk of over-stress or rupture of the fusible link.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for programming an electrical fuse using a silicon-controlled rectifier that has a terminal coupled with the electrical fuse, the method comprising:
   directing a programming current for the electrical fuse through the electrical fuse and the silicon-controlled rectifier; and
   switching the silicon-controlled rectifier from a low-impedance state to a high-impedance state that interrupts the programming current upon reaching a first programmed resistance value for the electrical fuse,
   wherein the electrical fuse is a closed electrical circuit after the first programmed resistance value is reached and the programming current is interrupted.

2. The method of claim 1 wherein directing the programming current through the electrical fuse and the silicon-controlled rectifier further comprises:
   receiving a triggering pulse at a gate of the silicon-controlled rectifier,
   wherein the silicon-controlled rectifier switches from the high-impedance state to the low-impedance state in response to receiving the triggering pulse, and a duration for the triggering pulse is at least an order of magnitude less than a time interval required to program the electrical fuse.

3. The method of claim 2 further comprising:
   directing the triggering pulse from a trigger pulse generator to the gate of the silicon-controlled rectifier,
   wherein the programming current is less than a current at which the electrical fuse would blow to create an open electrical circuit.

4. The method of claim 2 wherein the silicon-controlled rectifier remains in the low-impedance state after the triggering pulse ends, and the silicon-controlled rectifier automatically switches from the low-impedance state to the high-impedance state at a holding voltage and a holding current for the silicon-controlled rectifier that are related to the first programmed resistance value for the electrical fuse.

5. The method of claim 1 wherein the silicon-controlled rectifier has a holding voltage and a holding current at which the silicon-controlled rectifier automatically switches from the low-impedance state to the high-impedance state, and the holding voltage and the holding current of the silicon-controlled rectifier are related to the first programmed resistance value for the electrical fuse.

6. The method of claim 5 where the holding current of the silicon-controlled rectifier is between 0.2 milliamps and 5 milliamps.

7. The method of claim 5 where the holding voltage of the silicon-controlled rectifier is between 0.7 volts and 1.5 volts.

8. The method of claim 5 wherein the silicon-controlled rectifier and the electrical fuse are coupled in series between a positive power supply and a negative power supply, and the programming current for the electrical fuse is directed through the electrical fuse and the silicon-controlled rectifier from the positive power supply to the negative power supply.

9. The method of claim 8 wherein the first programmed resistance value for the electrical fuse is determined based in part on a first voltage level of the positive power supply.

10. The method of claim 9 wherein the electrical fuse has a second programmed resistance value at a second voltage level of the positive power supply that is different from the first voltage level.

11. A circuit comprising:
   an electrical fuse configured to be programmed by application of a programming current over a time interval;
   a silicon-controlled rectifier including a gate, a first terminal coupled with the electrical fuse, and a second terminal; and
   a trigger pulse generator coupled with the gate of the silicon-controlled rectifier, the trigger pulse generator configured to direct a triggering pulse to the gate of the silicon-controlled rectifier having a duration that is at least an order of magnitude less than the time interval required to program the electrical fuse.

12. The circuit of claim 11 wherein the silicon-controlled rectifier has a holding voltage and a holding current at which the silicon-controlled rectifier automatically switches from a low-impedance state to a high-impedance state, and the holding voltage and the holding current are determined based at least in part on a predetermined programmed resistance value for the electrical fuse.

13. The circuit of claim 12 wherein the holding current of the silicon-controlled rectifier is between 0.2 milliamps and 5 milliamps, and the holding voltage of the silicon-controlled rectifier is between 0.7 volts and 1.5 volts.

14. The circuit of claim 11 wherein the time interval is 10 nanoseconds to 10 microseconds.

15. A method for designing a silicon-controlled rectifier for use in programming an electrical fuse, the method comprising:
   determining, using a processor, a holding current and a holding voltage for the silicon-controlled rectifier that provide a first programmed resistance value for the electrical fuse.

16. The method of claim 15 wherein determining the holding current and the holding voltage for the silicon-controlled rectifier further comprises:
   selecting a layout for the silicon-controlled rectifier determined to provide the holding current and the holding voltage for the silicon-controlled rectifier.

17. The method of claim 16 where the layout for the silicon-controlled rectifier is selected such that the holding current of the silicon-controlled rectifier is between 0.2 milliamps and 5 milliamps.

18. The method of claim 16 where the layout for the silicon-controlled rectifier is selected such that the holding voltage of the silicon-controlled rectifier is between 0.7 volts and 1.5 volts.

19. The method of claim 15 wherein the holding current and the holding voltage are determined at a first voltage level for a power supply used to supply a programming current to the electrical fuse, the electrical fuse has the first programmed resistance value at the first voltage level, and the electrical fuse has a second programmed resistance value at a second voltage level different from the first voltage level.

20. The method of claim 15 wherein the holding current and the holding voltage are determined at a first voltage level for a power supply used to supply a programming current to the electrical fuse, the first programmed resistance value used in the determination is proportional to a difference between the first voltage level and the holding voltage, and the first programmed resistance value used in the determination is inversely proportional to the holding current.

* * * * *